(12) United States Patent
Chiou et al.

(10) Patent No.: US 9,764,947 B2
(45) Date of Patent: *Sep. 19, 2017

(54) PIEZORESISTIVE PRESSURE SENSOR DEVICE

(71) Applicant: Continental Automotive Systems, Inc., Auburn Hills, MI (US)

(72) Inventors: Jen-Huang Albert Chiou, Libertyville, IL (US); Shiuh-Hui Steven Chen, Lake Zurich, IL (US)

(73) Assignee: Continental Automotive Systems, Inc., Auburn Hills, MI (US)

(*) Notice: Subject to any disclaimer, the term of this patent is extended or adjusted under 35 U.S.C. 154(b) by 87 days.

This patent is subject to a terminal disclaimer.

(21) Appl. No.: 14/931,034

(22) Filed: Nov. 3, 2015

(65) Prior Publication Data

US 2016/0146685 A1 May 26, 2016

Related U.S. Application Data

(60) Provisional application No. 62/084,217, filed on Nov. 25, 2014.

(51) Int. Cl.
| | |
|---|---|
| *G01L 9/06* | (2006.01) |
| *B81C 1/00* | (2006.01) |
| *G01L 9/00* | (2006.01) |

(52) U.S. Cl.
CPC ........ *B81C 1/00158* (2013.01); *G01L 9/0044* (2013.01); *G01L 9/0045* (2013.01); *G01L 9/0047* (2013.01); *G01L 9/0052* (2013.01); *G01L 9/0054* (2013.01); *B81C 2201/013* (2013.01)

(58) Field of Classification Search
None
See application file for complete search history.

(56) References Cited

U.S. PATENT DOCUMENTS

| | | | |
|---|---|---|---|
| 4,093,933 A | 6/1978 | Wilner | |
| 4,570,498 A | 2/1986 | Okayama | |
| 6,006,607 A | 12/1999 | Bryzek et al. | |
| 7,997,142 B2 * | 8/2011 | Chiou | .............. G01L 9/0042 |
| | | | 73/715 |
| 2006/0144153 A1 | 7/2006 | Brosh | |
| 2011/0005323 A1 | 1/2011 | Enomoto et al. | |
| 2011/0023618 A1 | 2/2011 | Chiou et al. | |
| 2011/0146411 A1 | 6/2011 | Doering et al. | |

FOREIGN PATENT DOCUMENTS

| | | |
|---|---|---|
| CN | 101271028 A | 9/2008 |
| CN | 102647657 A | 8/2012 |
| JP | S5983023 A | 5/1984 |
| WO | 2011/083158 A2 | 7/2011 |

OTHER PUBLICATIONS

English translation of abstract for CN102647657A.
English translation of abstract for CN101271028A.
Search Report dated Jun. 25, 2015, from corresponding GB Patent Application No. GB1500472.4.

* cited by examiner

*Primary Examiner* — Andre Allen

(57) ABSTRACT

The voltages output from a low-pressure MEMS sensor are increased by increasing the sensitivity of the sensor. Sensitivity is increased by thinning the diaphragm of the low pressure sensor device. Nonlinearity increased by thinning the diaphragm is reduced by simultaneously creating a cross stiffener on the top side of the diaphragm. An over-etch of the top side further increases sensitivity.

19 Claims, 18 Drawing Sheets

PIEZORESISTIVE PRESSURE SENSOR DEVICE

BACKGROUND

Solid state microelectromechanical system (MEMS) pressure sensors are well known. For example, U.S. Pat. No. 4,236,137 to Kurtz, et al. discloses a semiconductor pressure transducer. U.S. Pat. No. 5,156,052 to Johnson, et al. also discloses a solid state pressure transducer. U.S. Pat. No. 6,006,607 to Bryzek, et al. discloses a pressure sensor that uses a piezoresistive device. U.S. Pat. Nos. 5,178,016 and 6,093,579 also discloses solid state pressure sensors.

A well-known problem with prior art MEMS pressure sensors, which use piezoresistive devices formed into a thin silicon diaphragm, is pressure nonlinearity or PNL. The PNL is a function of the silicon diaphragm's deflection. The greater the diaphragm deflection, the greater degree of output nonlinearity, whether the piezoresistance is detected and measured as a voltage or current.

Output nonlinearity becomes more problematic in sensors that are intended to detect low pressures, e.g., pressures below 10 kPa. Since low pressure sensing devices require very thin silicon diaphragms, the diaphragm deflection in a thin diaphragm tends to aggravate the PNL in pressure sensors that are designed to measure low pressures. Another problem with thin silicon diaphragms is that they are fragile. A major challenge is to create a diaphragm to lower or reduce PNL while improving pressure sensitivity without increasing the die size for a low pressure sensor. A solid state piezoresistive pressure sensor that can be used at low pressures and which has an improved output linearity and which is more rugged and more sensitive than those in the prior art would be an improvement.

BRIEF SUMMARY

In accordance with embodiments of the invention the voltages output from a low-pressure MEMS sensor are increased by increasing the sensitivity of the sensor. Sensitivity is increased by thinning the diaphragm of the low pressure sensor device. Nonlinearity increased by thinning the diaphragm is reduced by simultaneously creating a cross stiffener on the top side of the diaphragm. An over-etch of the top side further increases sensitivity.

DETAILED DESCRIPTION

Figure 1:
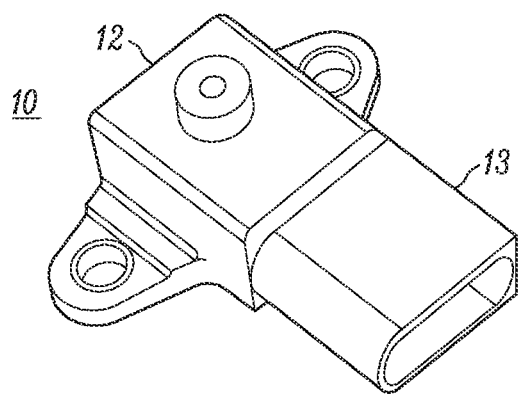
FIG. 1 and FIG. 2 are perspective views of a pressure sensor.
Figure 2:
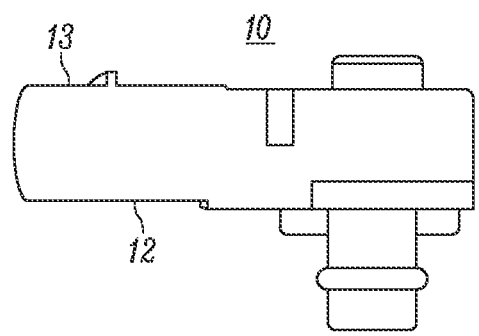
Figure 3:
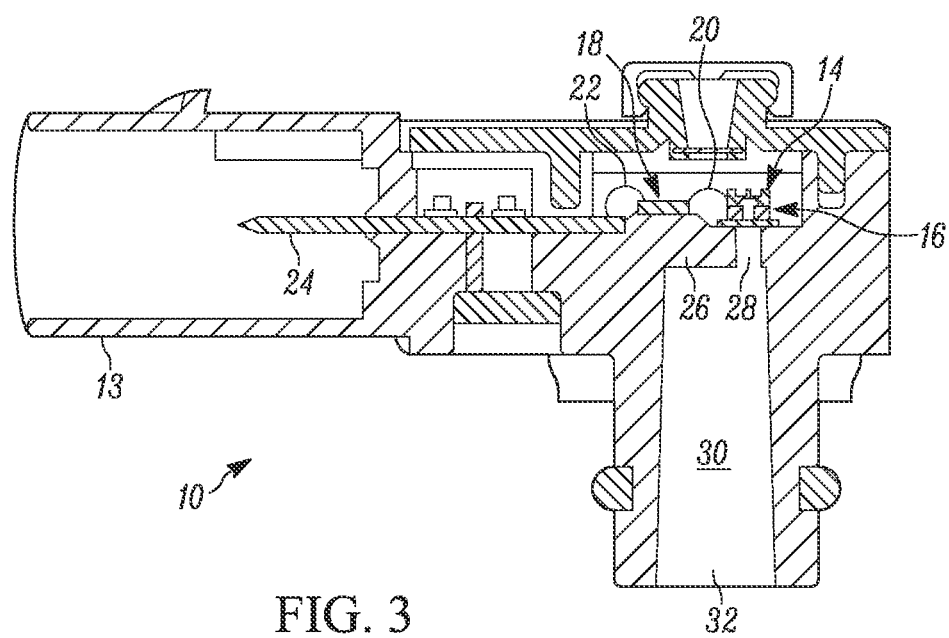
FIG. 3 is a cross-sectional view of the pressure sensor shown in FIG. 1 and FIG. 2.

FIG. 1 is a perspective view of a pressure sensor 10 for use in automotive and industrial pressure sensing applications. FIG. 2 is a side view of the pressure sensor 10. FIG. 3 is a cross-sectional diagram of the pressure sensor 10 shown in FIG. 1 and FIG. 2.

In FIGS. 1, 2, and 3, the sensor 10 comprises an injection molded plastic housing 12 that comprises an elongated, hollow shroud portion 13. The shroud 13 protects one or more lead frame 24 that pass through the plastic material from which the housing 12 is made. The lead frame 24 provides electrical pathways into a pocket 16 inside the housing 12 where a pressure sensing element, identified by reference numeral 14, is mounted with die-mount adhesive above a hole 28 formed through a substrate 26. The hole 18 is aligned with an open passageway 30 of a port 32. A liquid or gas, the pressure of which is to be measured by the pressure sensing element 14, is able to pass through the passageway 30 and hole 18 in the substrate 26 and exert pressure on a diaphragm, (not visible in FIG. 1) from which the pressure sensing element is made.

The pressure sensing element 14 with a thin diaphragm is located inside a pocket 26 of the housing 12. An application-specific integrated circuit (ASIC) 18, also located inside the pocket 16 includes electronic devices to output a voltage that is proportional to changes in the resistance of one or more "distributed" piezoresistive devices formed in the sensing element 14 and which are electrically connected to each other to form a Wheatstone bridge circuit.

Figure 4:
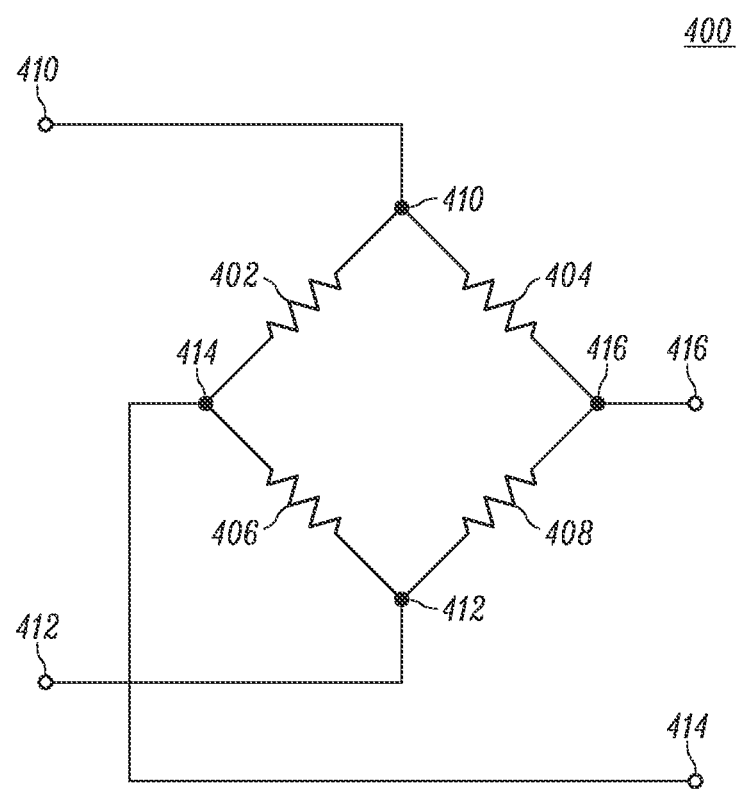
FIG. 4 depicts the topology of a Wheatstone bridge circuit.

FIG. 4 illustrates the topology of a Wheatstone bridge circuit 400 used in the pressure sensing element 14. The circuit 400 comprises four separate piezoresistors 402, 404, 406, and 408 connected to each other, "end-to-end" forming a loop having four nodes where the four piezoresistors are connected together. The piezoresistors 402, 404, 406, and 408 are formed by doping a P− semiconductor material into the top surface of a thin diaphragm made of an N-type epitaxial layer. The piezoresistors 402, 404, 406, and 408 are interconnected with interconnectors, formed by doping P+ interconnectors into the top surface of the N-type epitaxial layer. The P− semiconductor material comprising a resistor is limited to a small area and is thus localized in the N-type epitaxial layer. The resistors are connected to each other by interconnectors doped onto the top surface of the diaphragm. Two diagonally-opposite nodes 410, 412 are considered to be input terminals; the other two diagonally-opposite nodes 414, 416, are considered to be output terminals.

Those of ordinary skill in the art will recognize that the magnitude of a voltage applied to the input terminals 410, 412 will be divided by the ratio of the piezoresistors' resistance values and output across the output terminals 414, 416. Since the piezoresistors 402, 404, 406, and 408 are formed into a thin silicon diaphragm that deflects when a pressure is applied to the diaphragm, the physical size, shape, and electrical resistance of the piezoresistors 402, 404, 406, and 408 will change responsive to diaphragm deflection caused by pressure applied to the diaphragm.

Referring again to FIG. 3, the ASIC 18 includes circuitry that applies a voltage to the input terminals 410, 412 and measures the output voltage at the output terminals 414, 416. The ASIC 18 thus generates an electrically measurable output signal, which changes responsive to changes in the resistance of one or more resistors formed into the thin diaphragm of the sensing element 14. As best seen in FIG. 3, electrical signals from the electronic devices inside the ASIC 18 are routed through the housing 12 through the lead frame 24 that extends into the shroud 13 that surrounds the lead frame 24.

As used herein, a rectangle is a parallelogram, adjacent sides of which form right angles. A square is a rectangle, the sides of which have equal lengths. As described below, a micro-electromechanical system (MEMS) pressure sensing element is formed of a thin and substantially square-shaped silicon substrate, which has a thin epitaxial layer formed on a top surface of the substrate. The Wheatstone bridge circuit 400 with piezoresistors and interconnectors are doped into the top surface of the epitaxial layer. The top of the epitaxial layer is then etched to thin the layer and form a cross stiffener on the top of the epitaxial layer. Passivation layers, not visible, are then deposited on the top of the epitaxial layer to protect the circuitry. A portion of the bottom of the substrate is etched away to expose the bottom of the epitaxial layer to form a diaphragm. The dimensions of the cross stiffener are sized, shaped, and arranged to reduce nonlinearity of a signal output from a Wheatstone bridge formed into the epitaxial layer.

Figure 5:
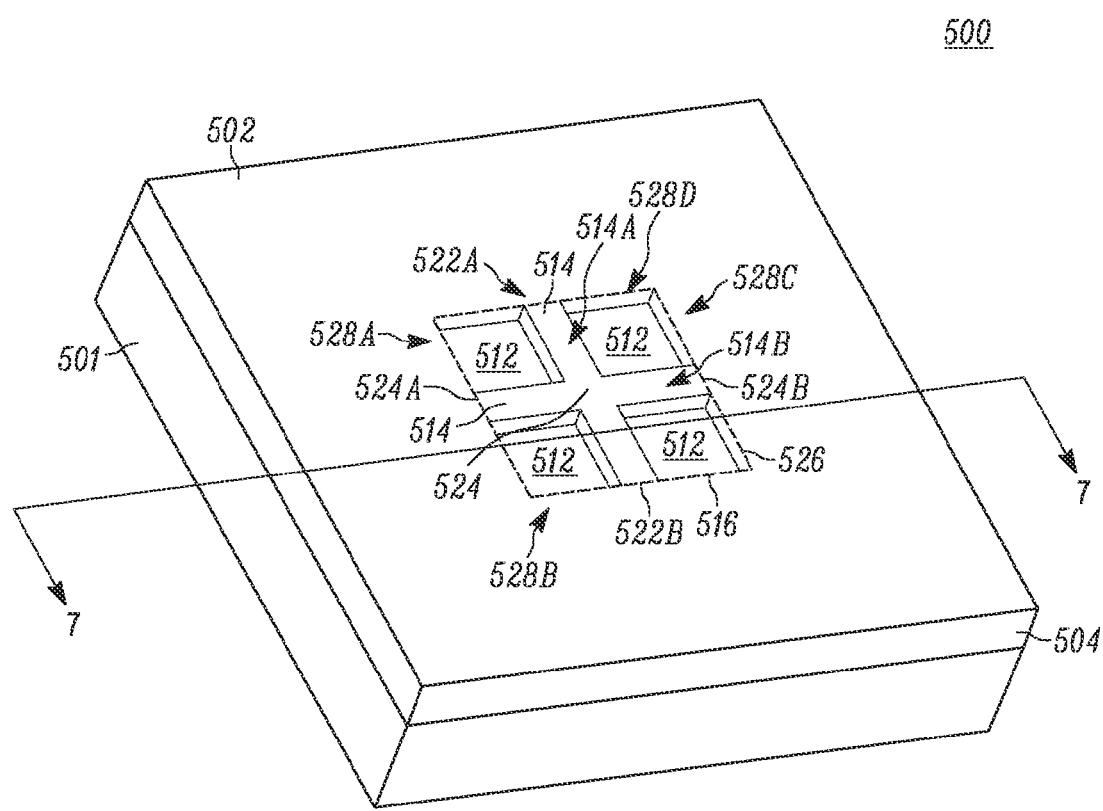
FIG. 5 is a perspective view of a first preferred embodiment of a pressure sensing element with high sensitivity, high accuracy and having a thin diaphragm and a topside cross stiffener.

FIG. 5 is a perspective view of a first embodiment of a pressure sensing element 500, which can be used in a housing such as the one shown in FIGS. 1-3 to provide a pressure sensor having high sensitivity, high accuracy and reduced nonlinearity. FIG. 5 shows the top side 502 of a thin epitaxial layer 504 formed onto the top side of the substrate 501.

Figure 6:
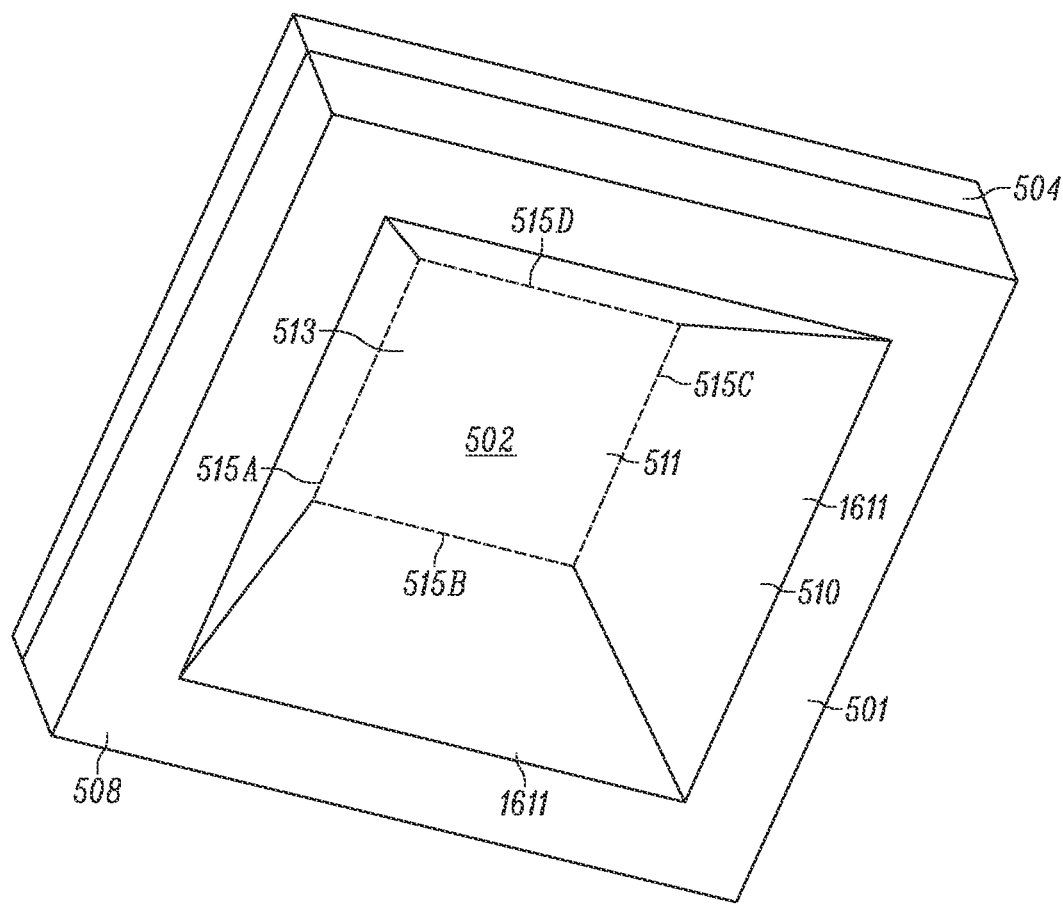
FIG. 6 is a perspective view of the bottom view of a pressure sensing element shown in FIG. 5.

FIG. 6 is a perspective view of the bottom side 508 of the sensing element 500. FIG. 6 shows a cavity 510 formed into the bottom side 508 of the substrate 501 by either a conventional sodium hydroxide (KOH) etching process or a deep reactive ion etching (DRIE) process.

Figure 7:
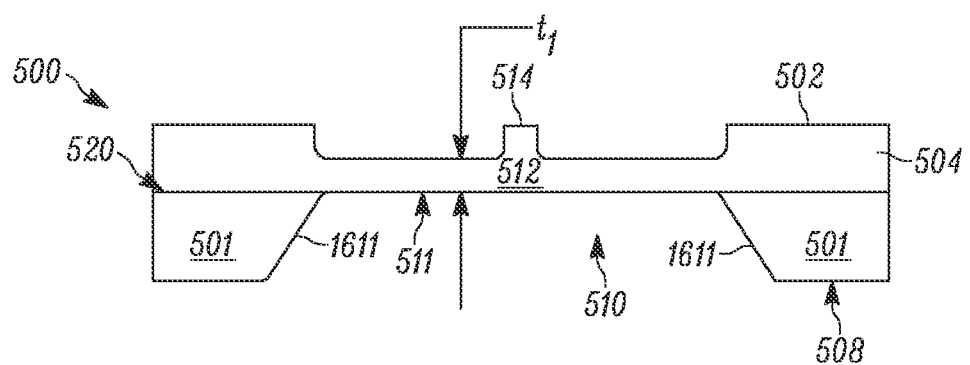
FIG. 7 is a cross-sectional view of the pressure sensing element shown in FIG. 5.

FIG. 7 is a cross-sectional view of the sensing element 500, shown in FIG. 5, through section lines 7-7. A cross stiffener 514 is formed into the top side 502 and a thin diaphragm 512 with t1 to indicate the thickness was formed by etching the bottom 508 of the substrate 501.

As best seen in FIG. 6 and FIG. 7, the bottom side 508 of the relatively thick silicon substrate 501 is etched away to expose a substantially square portion of the bottom side 511 of the epitaxial layer 504 formed on a top surface 520 of the silicon substrate 501. The exposed portion of the bottom side 511 of the epitaxial layer 504 is of course substantially planar. After it is exposed, the bottom side 511 of the epitaxial layer is not etched any further, although an optional corner-rounding etch step can be performed to eliminate or at least reduces sharp corners between intersecting surfaces and thus reduces or eliminates stress concentrations at intersecting surfaces.

As best seen in FIG. 5 and FIG. 7, a selective etching of the top side 502 of the epitaxial layer 504 provides four, substantially square and substantially equal-sized quadrants 512, each of which is a thin layer of the material comprising the epitaxial layer 504. The quadrants 512 are defined by epitaxial layer material that is either not etched or which is only partially etched, i.e., material of the epitaxial layer is left behind, the shape of such material being essentially cross-shaped (+) and identified in FIG. 5 by reference numeral 514. The cross-shaped material that is not etched away adds stiffness to the portion of the epitaxial layer that is etched away and is thus considered herein to be a cross-shaped stiffener or simply a cross stiffener 514.

Selective etching of the top side 502 of the epitaxial layer 504 to form the cross stiffener 514 and thinned quadrants 512 is performed within a localized and substantially square-shaped portion of the top side 502 of the layer 504, said located portion being identified by a broken line identified by reference numeral 516.

As can be seen in FIG. 7, the diaphragm 512 has a thickness, t1. The thickness is preferably between about 1.5 microns and about 5.0 microns. It therefore deflects easily when a pressure is applied to it. The cross stiffener and epitaxial layer thickness is preferably greater, i.e., between about 5.0 microns and about 15.0 microns.

Microelectromechanical system (MEMS) pressure sensors employ piezoresistors formed into the epitaxial layer that forms a diaphragm. Deflection of the diaphragm causes the resistors' values to change. A non-linear deflection causes the resistance change to be non-linear. A cross stiffener, which is provided in the top surface of the diaphragm, results in a more linear voltage output responsive to an applied pressure. As shown in FIG. 5, the cross stiffener 514 comprises two beams identified by reference numerals 514A and 514B. The beams 514A, 514B are substantially orthogonal to each other and have corresponding opposite ends 522A, 522B, 524A, 524B. The "ends" of the beams are material of the epitaxial layer 504, not etched away. The ends of the beams are thus fixed to the epitaxial layer 504. Since the beams' ends 522A, 522B, 524A, 524B are fixed, the beams 514A, 514B are considered to be fixed-end or fixed-fixed beams. The beams 514A, 514B nevertheless extend away from the non-etched portion of the epitaxial layer 504.

The beams 514A, 514B, support and stiffen the diaphragm 512, against which a pressurized fluid, i.e., a liquid or gas, applies pressure. Since their deflection is inherently more linear than the deflection of a diaphragm, the beams linearize the deflection of the diaphragm 512 and thus linearize a signal output from a Wheatstone bridge that is formed from resistors that are doped into the ends of the beams that comprise the cross stiffener.

As stated above, the diaphragm 512 comprising four substantially square quadrants and the cross stiffener 514 are formed within a portion of the top side 502 of the epitaxial layer 504, which is substantially square and identified in FIG. 5 by a broken line identified by reference numeral 516. The area within the broken line 516 is identified by reference numeral 526. The square area 526 has of course four "sides," which are identified in FIG. 5 by reference numerals 528A-528D. The combined lengths of the sides 528A-528D define a perimeter of the square area 526.

Referring now to FIG. 6, the bottom side 511 of the epitaxial layer 504 exposed by the first etching process is also substantially square. That square area is identified in FIG. 6 by reference numeral 511. The sides of the square area 511 are identified by reference numerals 515A-515D. The combined lengths of the sides 514A-515D define a corresponding perimeter of the square area 511 of the bottom 511 of the epitaxial layer 504 exposed by etching.

In the embodiment of the pressure sensing element 500 shown in FIG. 5, the size of the "first" square area 526 and the size of the second square area 513 can be substantially the same or different in order to adjust pressure sensitivity and pressure nonlinearity. The perimeter of the first area 526 and the perimeter of the second area 513 can be therefore substantially the same or different.

Figure 10:
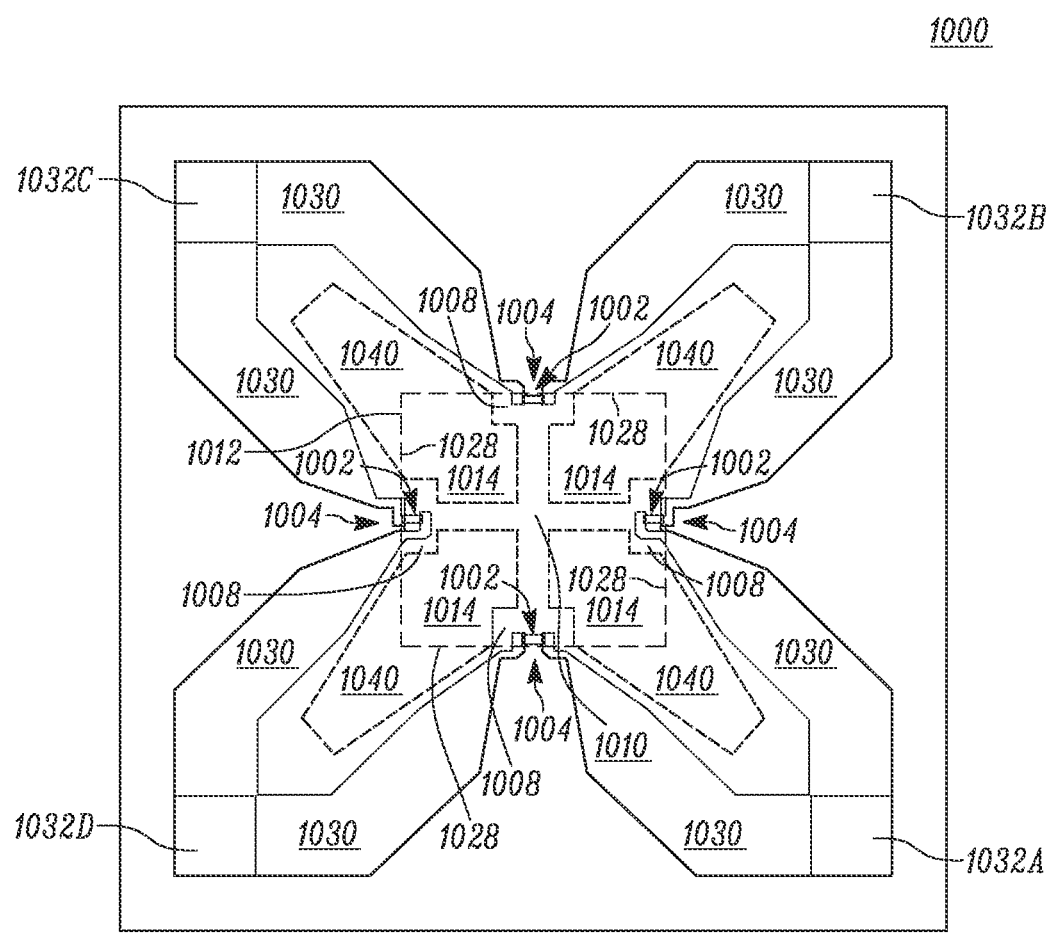
FIG. 10 is a plan view of the top side of a pressure sensing element with a topside cross stiffener and four anchors on an irregularly extended diaphragm as a generalized preferred embodiment.
Figure 11A:
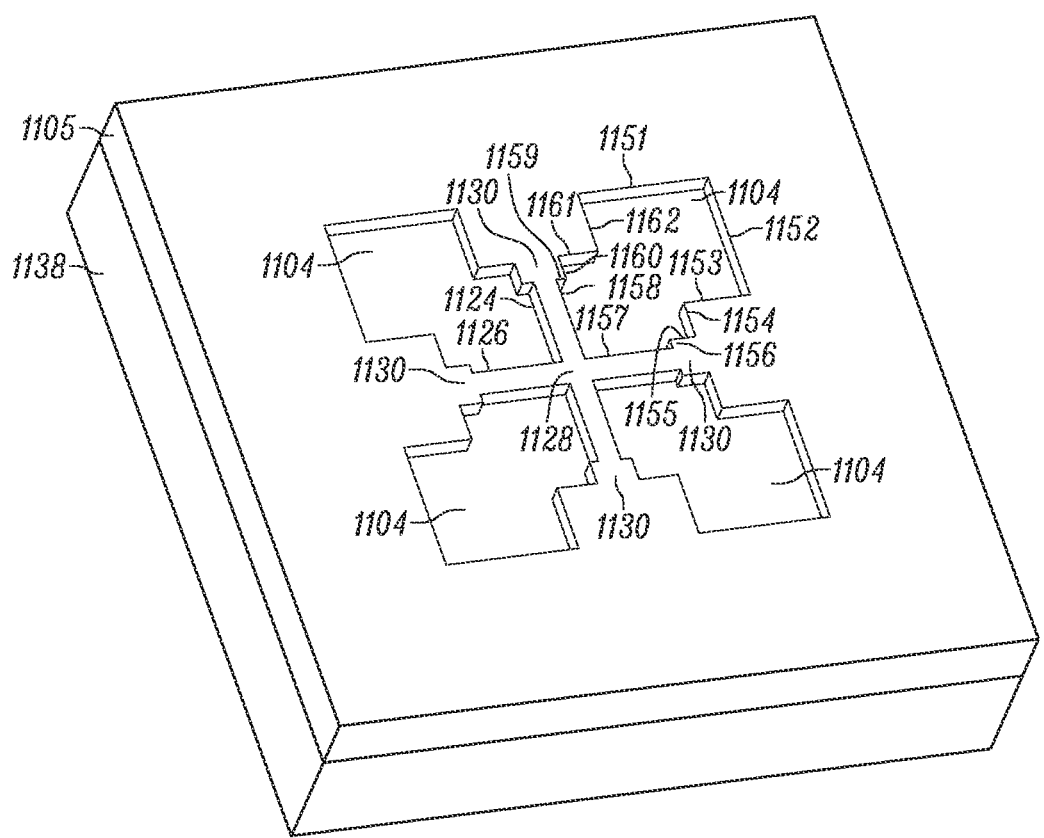
FIG. 11A is a perspective view of a third preferred embodiment of a pressure sensing element.
Figure 11B:
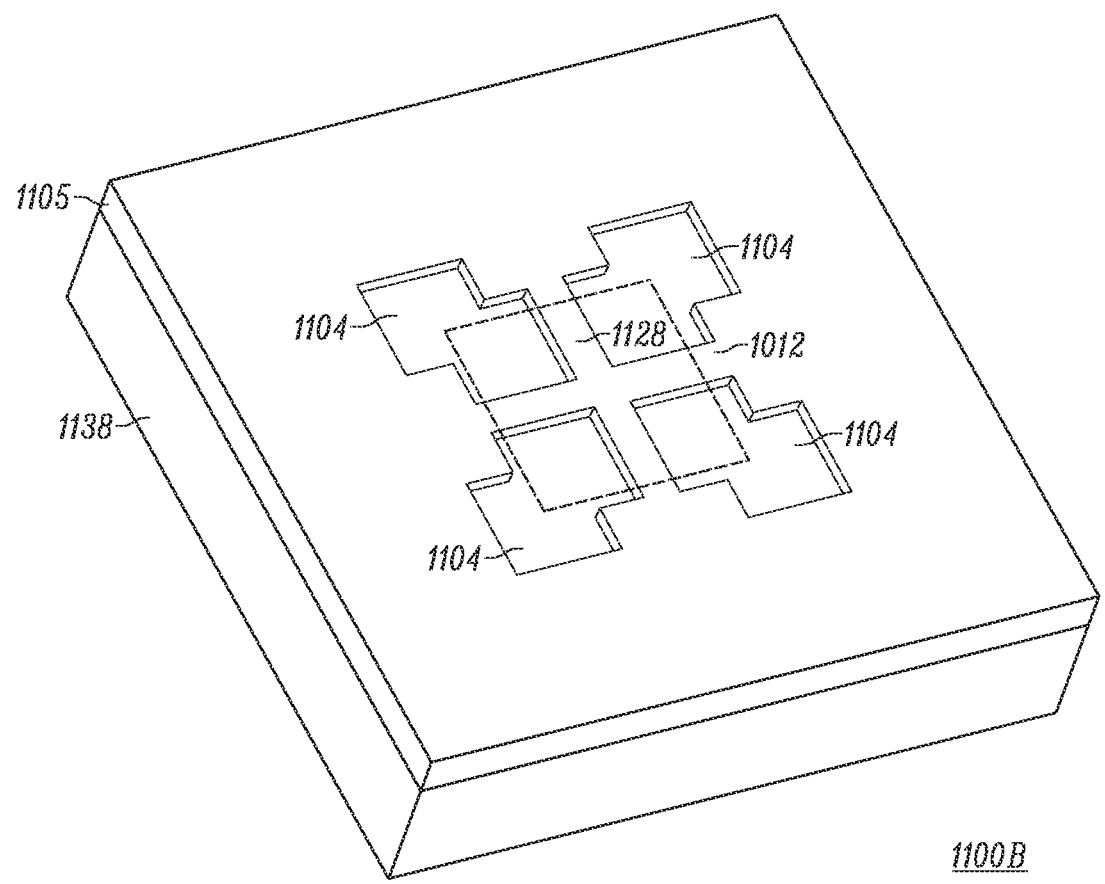
FIG. 11B is a perspective view of a fourth preferred embodiment of a pressure sensing element.

Computer modeling and experimental data show sensitivity of the pressure sensing element 500 shown in FIGS. 5-7 can be significantly improved and nonlinearity reduced even further if the first area 526 and first perimeter are greater than the second area 513 and second perimeter respectively. Stated another way, pressure sensing element sensitivity is increased and nonlinearity still meets the requirement when the top side 502 of the epitaxial layer 504 is provided with an extended etch region or "over etched" beyond the perimeter of the bottom side 511 of the epitaxial layer 504. Such extended etching/over etching is shown in FIG. 10 and FIGS. 11A and 11B.

Figure 8:
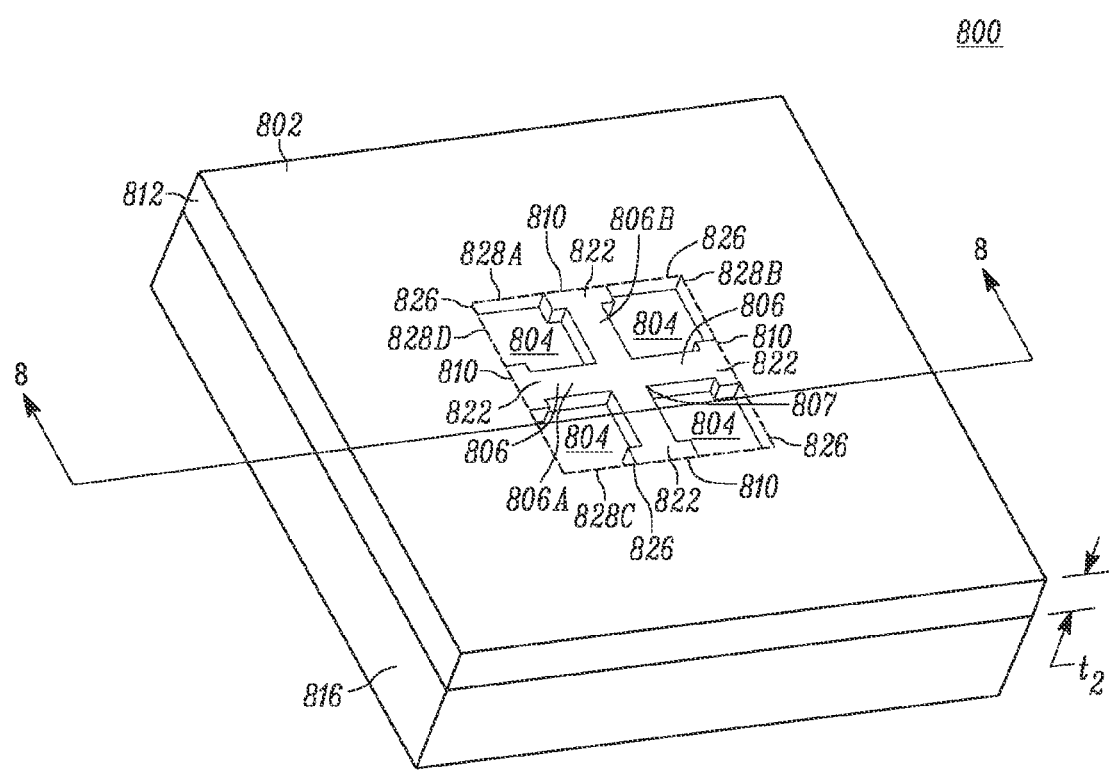
FIG. 8 is a perspective view of the top side of a second preferred embodiment of a pressure sensing element with a topside cross stiffener and 4 anchors.
Figure 9:
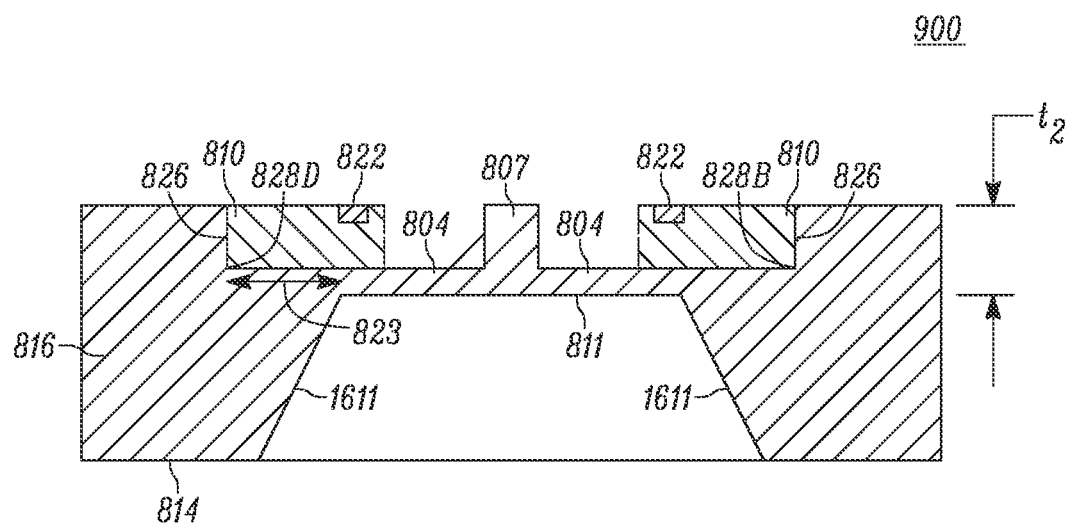
FIG. 9 is a cross sectional view of the pressure sensing element depicted in FIG. 10.

FIG. 8 is a perspective view of the top side 802 of a second preferred embodiment of a pressure sensing element 800, formed using the same steps/processes by which the pressure sensing element shown in FIGS. 5-7 is formed. FIG. 9 is a cross sectional view of the pressure sensing element shown in FIG. 8 through section lines 8-8.

The top side 802 of an epitaxial layer 812 is selectively etched to form four thinned quadrants that comprise a diaphragm 804 and a cross stiffener 806 comprising two, substantially orthogonal beams 806A and 806B. The beams 806A, 806B have a common midpoint 807 and extend across the diaphragm 804 and quadrants to where they meet or join, cross stiffener anchors 810.

The cross stiffener anchors 810 and cross stiffener beams 806A, 806B, are formed at the same time by selectively etching the epitaxial layer 812 formed onto the top surface of a single crystalline silicon substrate 816. The bottom side 814 of the substrate 816, not shown, is etched in the same way as the bottom side 508 of the substrate shown in FIG. 5-7.

The anchors 810 are substantially parallelepiped-shaped blocks of epitaxial layer material left behind after the etching process that thins the epitaxial layer to form the diaphragm 804. The beams 806A, 806B extend from the anchors 810 and are at right angles to each other.

Piezoresistors 822, from which a Wheatstone bridge is made, are formed into the anchors 810. The anchors 810 and stiffener beams 806A, 806B, have a thickness, t2, (See FIG. 9) selected to prevent leakage current from passing from P+ regions and P− regions into the N-type epitaxial layer 812 through P-N junctions. FIG. 9 shows an example with a larger topside perimeter 826 than the backside perimeter of a square 811 of the diaphragm. Reference numeral 823 depicts the horizontal distance between the edges of the two perimeters.

The dimensions of the cross stiffener 806 are determined analytically or experimentally via design of experiments (DOE). For a diaphragm 802 having a thickness between about 1.5 micrometers and about 5.0 micrometers, the height or thickness, t2, of the cross stiffener 806 should be between about 7.0 micrometers and about 15.0 micrometers and preferably about 8.5 micrometers.

As with the pressure sensing element shown in FIGS. 5-7, the pressure sensing element 800 shown in FIGS. 8 and 9 has its diaphragm 804 and cross stiffener 806 formed within an area, region, or portion of the top of the epitaxial layer 812, which is substantially square and identified in FIG. 8 by a broken line identified by reference numeral 826. The square area 826 has of course four "sides," which are identified in FIG. 8 by reference numerals 828A-828D. The combined lengths of the sides 828A-828D define a corresponding perimeter of the square area 826.

As with the pressure sensing element shown in FIGS. 5-7, the bottom side 811 of the epitaxial layer 812 that is exposed by etching the bottom surface 814 of the substrate 816 is also substantially square. That square area is also identified in FIG. 9 by reference numeral 811. The square area 811 of the bottom side of the epitaxial layer 812 has four sides of course, the combined lengths of which define a corresponding perimeter of the square area 811 of the bottom of the epitaxial layer 812 that is exposed by etching.

As best seen in FIG. 8, the square area 826 of the diaphragm 804, which is formed into the top side 802 of the epitaxial layer 812 and its corresponding perimeter can be smaller or greater than the area 811 and the corresponding perimeter of the bottom side of the epitaxial layer 812 that is exposed by etching the bottom of the substrate 816. If the area 826 is greater than the area 811, pressure sensitivity can be increased but pressure nonlinearity can be sacrificed. The design can be optimized to increase pressure sensitivity but reduce pressure nonlinearity by further over-etching the topside of diaphragm and widen the cross stiffener 806 and anchors. The shape of an over-etch area can be varied. Varying the over-etch will vary the performance of a pressure sensing element. FIG. 10 is a top view of a pressure sensing element 1000 showing a thin diaphragm having an over-etch that is an irregularly shaped polygon. FIG. 10 also depicts the locations of four piezoresistors 1002 formed into localized regions 1004 of the top surface of cross stiffener anchors 1008 from which extend substantially-orthogonal beams that comprise a cross stiffener 1010.

The piezoresistors 1002 are considered to be within a square area 1012, enclosed by a broken line. The square area 1012 comprises four thinned quadrants of a diaphragm 1014.

The square area identified by reference numeral 1012 also corresponds to and identifies the perimeter of the bottom of the epitaxial layer exposed by etching the bottom side of a silicon substrate on which the epitaxial layer is formed. The piezoresistors 1002 are doped into the top side of the epitaxial layer and in the anchors 1008.

The piezoresistors 1002 are considered herein to be "distributed" elements because they are not confined to one side or edge of the diaphragm 1014. They are instead separated from each other and located along the sides 1028 of the square area 1012

The piezoresistors 1002 are connected to each other by interconnectors 1030, which are formed by P+ conductive material doped into the N-type epitaxial layer. The P+ interconnectors 1030 extend from each end of a piezoresistor 1002 to metal bond pads 1032A-D. The bond pads 1032A-D provide connection terminals for the input and output voltages input to and output from a Wheatstone bridge circuit formed from the piezoresistors 1002. The bond pad 1032A is the Vp bond pad with an input voltage at 3 Volts. The bond pad 1032C is the Vn bond pad grounded. The bond pad 1032B is the Sn bond pad and the bond pad 1032D is the Sp bond pad. The voltage difference between the bond pads Sp and Sn is a voltage responsive to a pressure difference on the top and bottom sides of the diaphragm. The interconnectors 1030 to connect Vp to Sp are about the same as the interconnectors 1030 to connect Vp to Sn. Also, the interconnectors 1030 to connect Sp to Vn are about the same as the interconnectors 1030 to connect Sn to Vn. The substantial symmetry of the interconnector circuitry alleviates effects or signal noises subjected to environment.

Still referring to FIG. 10, four irregular-shaped areas 1040 are bounded by broken lines. Those areas are "extended etch" areas of the top surface of an epitaxial layer. And, parts of the irregular-shaped areas are inside the square area identified by reference numeral 1012 and thus directly above the portion of the epitaxial layer exposed by etching the bottom of a silicon substrate on which the epitaxial layer is formed. The extended etch areas 1040 are outside the square area 1012 and are areas of the epitaxial layer top surface that are etched "beyond" or outside the perimeter of the bottom of the epitaxial layer exposed by etching through the bottom surface of a substrate on which the epitaxial layer is formed.

As used herein, a polygon is considered to be a closed and substantially planar figure, which is bounded by either straight or curved lines. A regular polygon is considered to be a polygon, the sides of which are of equal length. An irregular polygon is considered to be a polygon, the sides of which are not the same nor are the interior angles.

The irregular-shaped areas 1040 bounded by the broken lines are thus considered herein to be irregular polygons. The bottom of the epitaxial layer exposed by etching the bottom of a silicon substrate is square and is thus a regular polygon.

Figure 12:
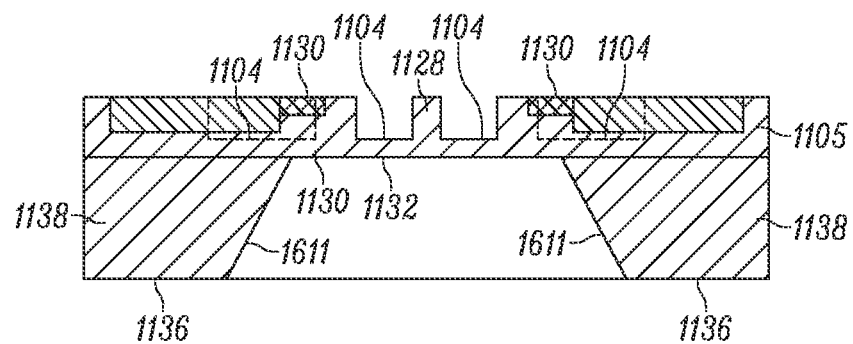
FIG. 12 is a cross-sectional view of the pressure sensing element shown in FIG. 11A.

FIG. 11A is a perspective view of the top side 1102 of a preferred embodiment of a pressure sensing element 1100. FIG. 12 is a cross-sectional view of the pressure sensing element 1100 shown in FIG. 11.

Extended etch regions 1104 of an epitaxial layer 1105 have a shape that is a closed irregular polygon and which comprise thinned quadrants of a diaphragm. The extended etch region of one of the quadrants is bounded by broken lines identified by reference numerals 1151-1162.

Two cross beams 1124, 1126, which remain after the top surface is etched to form a cross stiffener 1128, are located on the top of a diaphragm that is etched from the backside of a substrate 1138 and formed afterwards. As described above, the cross stiffener 1128 stiffens the diaphragm. The cross beams 1124, 1126 that comprise the cross stiffener 1128 extended between anchors 1130 located at each end of the cross beams 1124 and 1126 and which are also epitaxial layer material left behind after the top surface is etched.

As best seen in FIG. 12, the extended etch regions 1104 extend beyond the area 1132 of an epitaxial layer 1105 exposed by etching away the bottom side 1136 of the substrate 1138 on which the epitaxial layer 1105 is formed. For some cases, a wider cross stiffener 1128 may be needed to stiffen the diaphragm to reduce pressure nonlinearity. When the cross stiffener 1128 is wider than anchors 1130, the anchors disappear. A perspective view of the topside of such an embodiment 1100B is depicted in FIG. 11B wherein reference numeral 1104 shows over-etched regions and reference numeral 1012 identifies a square that is drawn with broken lines in order to show the location of the bottom perimeter of a thinned diaphragm.

Figure 13:
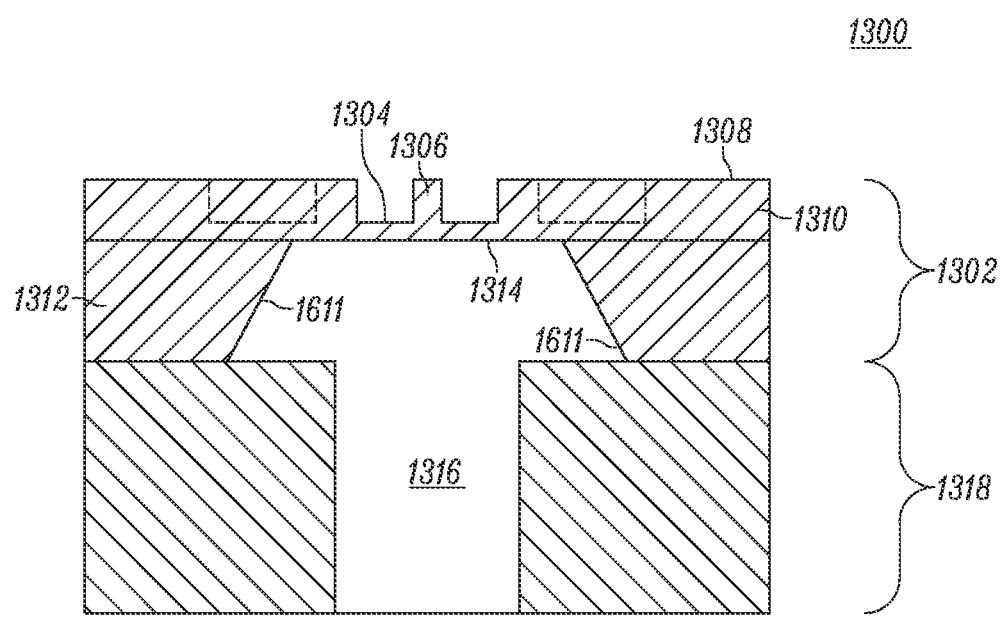
FIG. 13 is a cross-sectional view of a backside absolute pressure.

FIG. 13 is a cross-sectional view of a pressure sensor 1300 formed by a pressure sensing element 1302 having a thinned diaphragm 1304 and cross stiffener 1306 formed into the top side 1308 of an epitaxial layer 1310 that is formed onto a silicon substrate 1312. Fluid pressure is applied to the bottom side 1314 of the epitaxial layer 1310 through a tube or port 1316 that extends through a pedestal 1318 made of glass or silicon substrate and to which the pressure sensing element 1302 can be attached by anodic bonding or fusing bonding. The pressure sensing element 1302 and pedestal 1318 can be mounted to a surface inside a pocket formed within a housing, such as the one shown in FIGS. 1-3.

Figure 14:
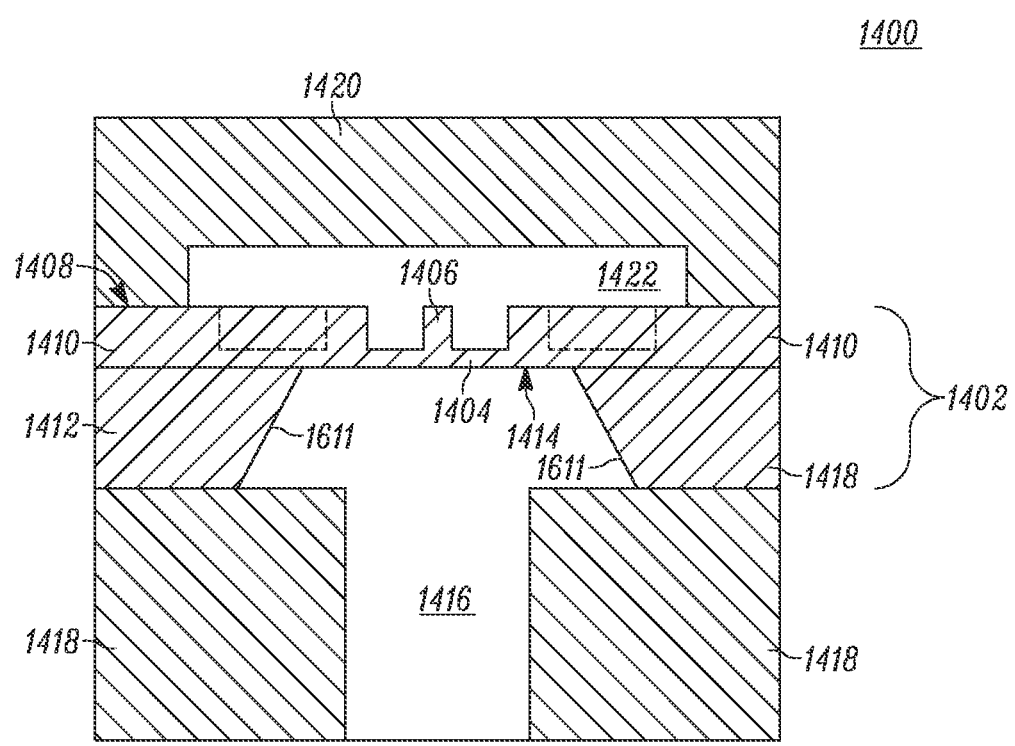
FIG. 14 is a cross-sectional view of a differential pressure sensor.

FIG. 14 is a cross-sectional view of a differential pressure sensor 1400 formed by a pressure sensing element 1402 having a thinned diaphragm 1404 and cross stiffener 1406 formed into the top side 1408 of an epitaxial layer 1410, which is formed onto a silicon substrate 1412. A first fluid pressure is applied to the bottom 1414 side of the epitaxial layer 1410 through a tube or port 1416 that extends through a pedestal 1418 that is made of glass or silicon substrate. The pedestal 1418 and pressure sensing element 1402 are joined to each other by fusing or anodic bonding. A cap 1420 having an internal cavity 1422 encloses a fluid or a vacuum, which of course exerts at least some pressure on the diaphragm 1404. The deflection of the diaphragm 1404 is thus dependent on the difference between the pressure or vacuum inside the cavity 1422 and the pressure applied through the port 1416.

Figure 15:
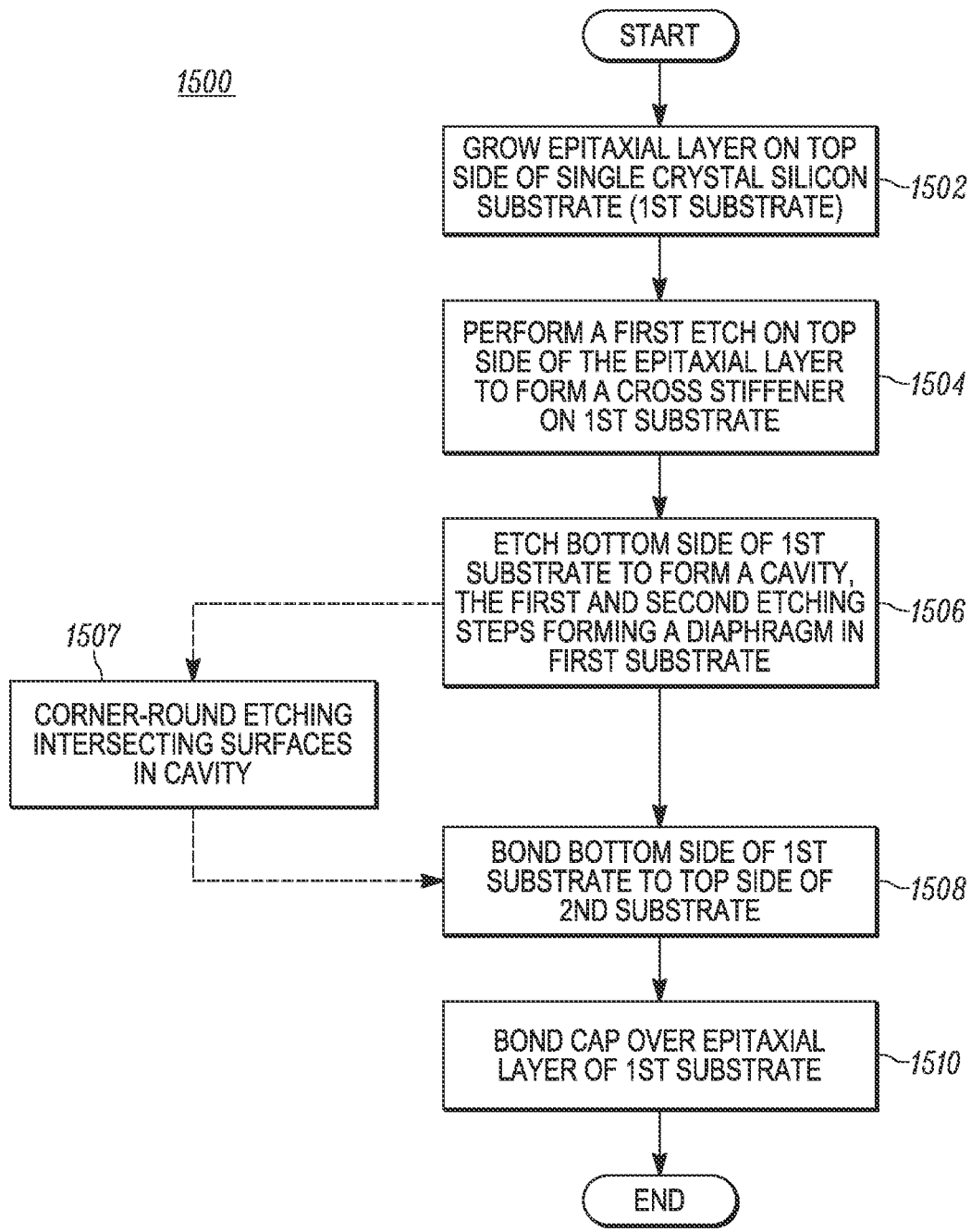
FIG. 15 is a flow chart showing steps of a method of forming a pressure sensing element with a topside cross stiffener.

FIG. 15 is a flow chart showing steps of the method of forming the pressure sensor using a MEMS pressure sensing element having a cross stiffener on the top side of a thin diaphragm.

At a first step 1502, an epitaxial layer is formed on a top side of a single crystal silicon substrate (the first substrate) using conventional methods. The thickness of the epitaxial layer is thin, preferably less than about 20 microns.

At a second step 1504, a first etch is performed on the top side of the epitaxial layer to selectively remove material from the top side of the epitaxial layer to form a cross stiffener.

In a third step 1506, the bottom side of the single crystal silicon layer is etched to define or form a cavity. The second etch removes all of the single crystalline layer material to expose the back side of the epitaxial layer that was formed on the substrate. The first and second etching steps form a diaphragm in the first substrate. In a preferred embodiment, a third etch step, referred to herein as a corner rounding etching step 1507, is optionally performed on the bottom side of the silicon layer, which rounds interior corners, especially where the epitaxial layer meets the substrate and thereby reduces stress concentrations that would otherwise develop without the corner rounding etching.

At a fifth step 1508, the substrate having the epitaxial layer is bonded or otherwise attached to the top side of a second substrate made of glass or silicon and which is considered to be a support for the first substrate. The second substrate can have a hole formed through it depending upon whether the resultant pressure sensing element is to be a differential pressure sensor or topside absolute pressure sensor.

Lastly, at step 1510, a cap can be applied to the top side of the first substrate to define an evacuated cavity above the diaphragm.

Figure 16:
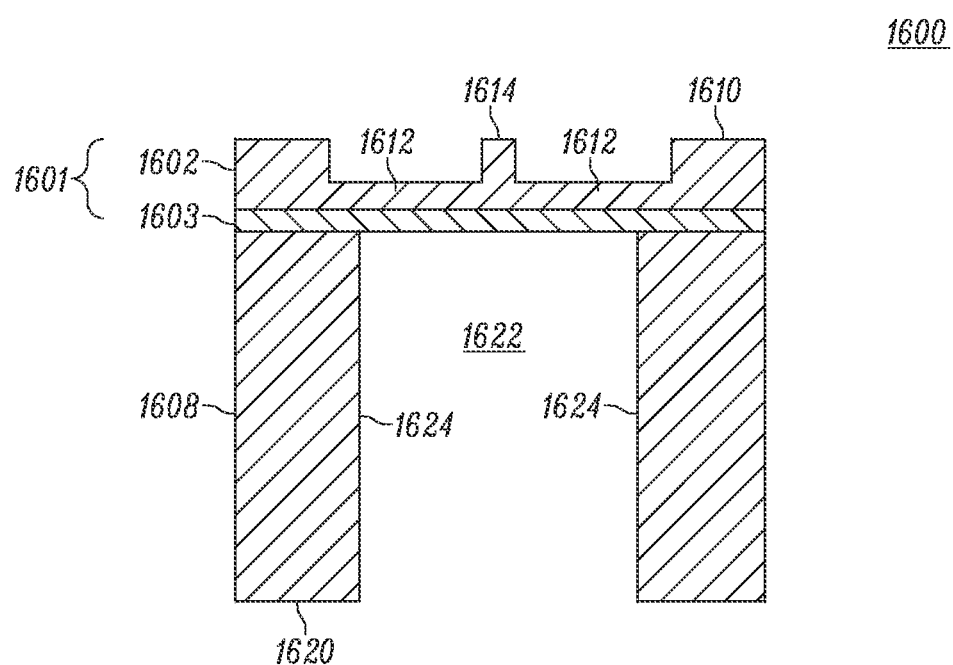
FIG. 16 is a cross-sectional view of the pressure sensing element with a cross stiffener in the topside and vertical walls in the backside.

In each of the pressure sensing elements described above, the silicon substrate is depicted as undergoing an etching process on the bottom of the substrate, which produces inclined or sloped sidewalls. In FIG. 16, a pressure sensing element 1600 is depicted as having a silicon substrate, the bottom of which is etched to expose an epitaxial layer but the sidewall formed through the substrate is substantially vertical.

In FIG. 16, a silicon substrate 1602 with a silicon dioxide layer 1603 as an insulator formed on the backside of the silicon substrate 1602 as a silicon on insulator (SOI) 1601 is fusion-bonded on a bottom silicon substrate 1608. A top side 1610 of the silicon substrate 1602 is etched as described above to form a cross stiffener 1614. A thinned diaphragm 1612 is formed by etching a bottom surface 1620 of the bottom silicon substrate 1608. The pressure signal due to the deflection of the diaphragm 1612 subjected to pressure is more linear due to a cross stiffener 1614, which is left behind by the top side etching process.

As with the embodiments described above, the silicon substrate 1608 in FIG. 16 has a bottom surface 1620 but the bottom surface 1620 is etched using a deep reactive ion etching (DRIE) process.

As can be seen in FIG. 16, the DRIE process forms a hole 1622 in the bottom surface 1620 that extends completely through the substrate 1608 just as a KOH etching does, but the DRIE etch provides a hole 1622, the sidewall 1624 of which is essentially vertical and unlike the inclined sidewalls that are formed by a sodium hydroxide (KOH) etching process. The inclined or sloped sidewalls that result from a KOH etch are depicted in FIGS. 6, 7, 12, 13, and 14 and identified therein by reference numeral 1611. The vertical or near-vertical sidewall 1624 formed using DRIE enables the footprint of a pressure sensing element of a desired area to be reduced because of the reduced footprint of the substrate that is needed by a DRIE etching process. Therefore, a second substrate as shown in FIGS. 13 and 14 for isolating packaging stress from the bottom side is no longer required if the bottom silicon substrate 1608 is thick enough with DRIE etching a cavity to form a diaphragm.

Figure 17:
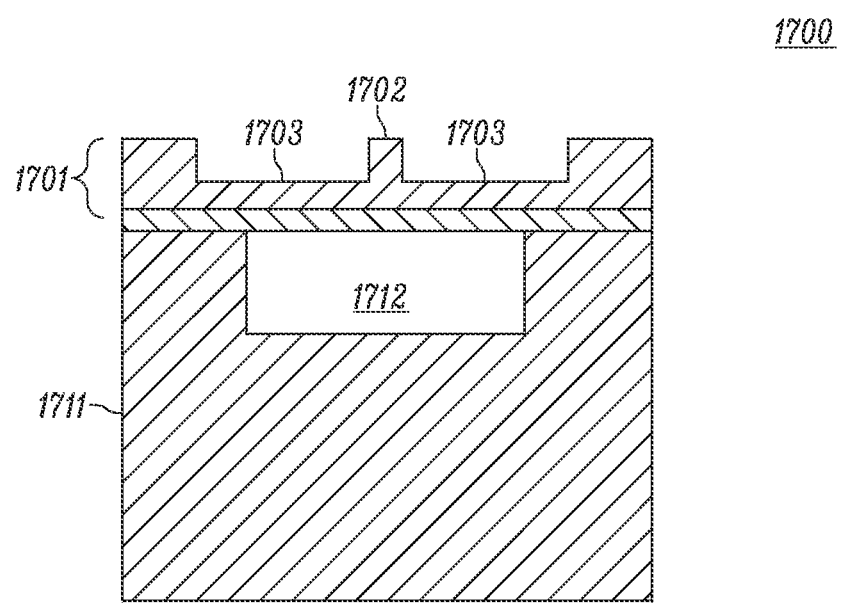
FIG. 17 is another preferred embodiment with a topside stiffener and a buried cavity in the bottom substrate for topside absolute pressure sensing.

A top side absolute pressure sensing device 1700 can be constructed using a SOI 1701 as described above and fusion-bonded to a bottom silicon substrate or pedestal 1711 with a buried cavity 1712 as shown in FIG. 17. The cross stiffener 1702 is etched on the top side of the SOI 1701, and the cavity 1712 is etched on the top side of the bottom silicon substrate 1711. The SOI 1701 and the bottom silicon substrate is fusion-bonded in a vacuum or substantially low pressure environment to form a top side absolute pressure sensing element with a thin diaphragm 1703, wherein the buried cavity 1712 is at least partially evacuated.

Figure 18:
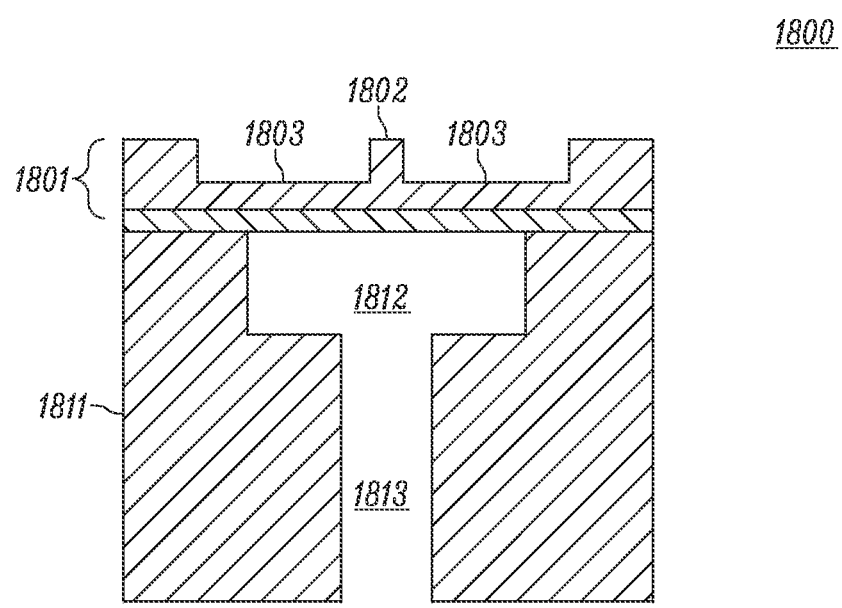
FIG. 18 is another preferred embodiment with a topside stiffener and a buried cavity connecting a through-hole in the bottom substrate for differential pressure sensing.

As shown in FIG. 18, a differential pressure sensing device 1800 can be constructed by creating a hole 1813 using DRIE to reach a buried cavity 1812 of a top side absolute pressure sensing device 1700 as depicted in FIG. 17 to allow the media at the bottom to reach the bottom surface of a diaphragm 1803. The diaphragm 1803 is formed by the cavity 1812 of a bottom silicon substrate 1811 and a SOI 1801 with a cross stiffener 1802 formed on the top side of the SOI 1801. The method to construct a differential pressure sensing device as illustrated in FIG. 18 may have an advantage over the method illustrated in FIG. 16 with a more precise control of a diaphragm thickness.

Figure 19:
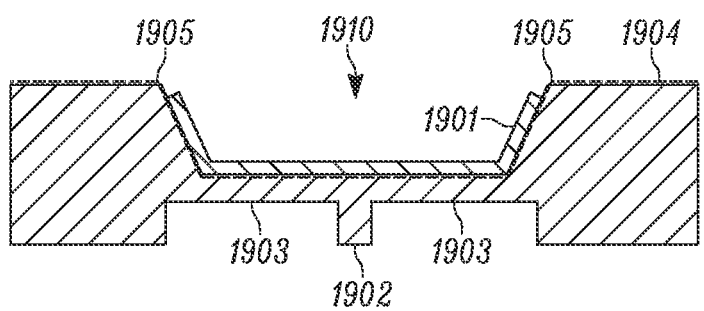
FIG. 19 is an embodiment with protecting films in the backside cavity.

Finally, protecting films 1901 such as plasma enhanced silicon oxide and silicon nitride can be deposited on a backside cavity 1910 of a pressure sensing element 1900 having a topside cross stiffener 1902 and a thin diaphragm 1903 as shown in FIG. 19. FIG. 19 is an upside down drawing of FIG. 7 plus the protecting films 1901 in the cavity 1910. Thin masking films are first applied in sequence on a full backside surface 1904, and then a photoresist (not shown) is coated on the top of thin films. Exposing the photoresist through a mask to light such as ultraviolet (UV), the portion of the photoresist outside the cavity and small portion of the photoresist inside edges 1905 of the cavity are removed and a desired photoresist is developed. The portion of thin films without the developed photoresist covered is then etched away, and the developed photoresist and the protecting films stay in the cavity 1910. In the last step, the photoresist is stripped and the protecting films 1901 are exposed inside the cavity 1910. The protecting films 1901 can prevent residuals sticking in the cavity 1910 of the pressure sensing element and affect sensing accuracy. Protecting films or passivation layers deposited on the top side of the pressure sensing element to protect the circuitry are well-known to those of ordinary skill in the art. Therefore, details for processing the top side protecting films are not further described.

Those of ordinary skill in the art will recognize that the nearly-linear deflection of a cross stiffener described above will support and thus control deflection of a thin diaphragm. The cross stiffener dimensions, (height, width and length) can be determined experimentally or through computer modeling to stiffen a diaphragm as desired. A diaphragm can thus be made very thin to increase its sensitivity and increase its accuracy.

The foregoing description is for purposes of illustration only. The true scope of the invention is set forth in the following claims.

The invention claimed is:

1. A pressure sensing element comprising:
   a first substrate having top and bottom opposing sides;
   a diaphragm formed into the bottom of the first substrate and into the top of the first substrate, the diaphragm having top and bottom opposing sides, the bottom side of the diaphragm having a square first area and a first outer perimeter, the top side of the first substrate having a second area and a second outer perimeter inner portions of which form the top side of the diaphragm above the first area and the first perimeter, outer portions of the second area and the second perimeter extending out along the top side of the first substrate further than the first area and the first perimeter extend along the bottom side of the first substrate, the top side of the diaphragm comprising spaced-apart piezoresistors which are coupled to each other to form a Wheatstone bridge; and
   a cross-stiffener, formed into the top side of the diaphragm, the piezoresistors being formed in portions of the top side from which the cross-stiffener is formed and located inside the second perimeter and proximate to the first perimeter.

2. The pressure sensing element of claim 1, wherein the cross stiffener comprises:
   first and second orthogonal beam sections, which are formed from part of the top of the diaphragm, each beam section having first and second opposing ends; and anchors, formed as part of the top of the diaphragm and located at each end of both beam sections, wherein the piezoresistors are formed into the anchors.

3. The pressure sensing element of claim 1, wherein the second outer perimeter is a non-square closed polygon.

4. The pressure sensing element of claim 2, wherein the second outer perimeter is a non-square closed polygon.

5. The pressure sensing element of claim 1, wherein the diaphragm formed into the bottom of the first substrate has a sidewall, which is inclined.

6. The pressure sensing element of claim 1, wherein the diaphragm formed into the bottom of the first substrate has a sidewall, which is vertical.

7. The pressure sensing element of claim 1, wherein the diaphragm has a thickness between about 1.5 and about 5.0 microns and wherein the cross stiffener has a different thickness, which is between about 5.0 and about 15.0 microns.

8. The pressure sensing element of claim 1, further comprising a second substrate attached to the bottom of the first substrate.

9. The pressure sensing element of claim 1, further comprising a second substrate attached to the bottom of the first substrate, the second substrate having a hole, which is aligned with the diaphragm and configured to conduct a fluid toward the bottom side of the diaphragm.

10. The pressure sensing element of claim 9, further comprising a cap that covers the top side of the diaphragm and which defines a cavity above the top side of the diaphragm.

11. The pressure sensing element of claim 1, further comprising a Wheatstone bridge circuit with symmetric interconnectors.

12. The pressure sensing element of claim 1, further comprising at least one protecting film in at least one cavity.

13. A pressure sensor comprising:
   a housing having a pocket;
   an application-specific integrated circuit within the pocket; and
   a pressure sensing element located in the pocket and coupled to the integrated circuit, the pressure sensing element comprising:
   a first substrate having top and bottom opposing sides;
   a diaphragm formed into the bottom of the first substrate and into the top of the first substrate, the diaphragm having top and bottom opposing sides, the bottom side of the diaphragm having a square first area and a first outer perimeter, the top side of the first substrate having a second area and a second outer perimeter inner portions of which form the top side of the diaphragm above the first area and the first perimeter, outer portions of the second area and the second perimeter extending out along the top side of the first substrate further than the first area and the first perimeter extend along the bottom side of the first substrate, the top side of the diaphragm comprising spaced-apart piezoresistors which are coupled to each other to form a Wheatstone bridge; and
   a cross-stiffener, formed into the top side of the diaphragm, the piezoresistors being formed in portions of the top side from which the cross-stiffener is formed and located outside the second perimeter and proximate to the first perimeter.

14. A method of forming a pressure sensing element, the method comprising:
   forming an epitaxial layer on a top side of a silicon substrate;
   performing a first etch on the top side of the epitaxial layer, the first etch forming a cross stiffener from the epitaxial layer; and
   performing a second etch on the bottom side of the silicon substrate to form a cavity in the silicon substrate, the first and second etching steps forming a diaphragm in the silicon substrate such that the second etch defines a second area and a second perimeter that define a bottom of the diaphragm and such that the first etch extends over a first area and a first perimeter that are greater than the second area and the second perimeter.

15. The method of claim 14, further comprising: performing a corner rounding etch step in the cavity after the second etch step, the corner rounding etch step comprising a dry etch, which rounds interior corners formed by the second etch step.

16. The method of claim 14, wherein the step of performing a second etch defines a diaphragm thickness between about 1.5 and 5.0 microns and defines cross stiffener thickness between about 5.0 and about 15.0 microns.

17. The method of claim 14, further comprising: attaching the substrate to a pedestal, which supports the substrate.

18. The method of claim 14, further comprising: attaching the substrate to a pedestal having a hole aligned with the diaphragm, the hole allowing a fluid to be applied to the diaphragm.

19. The method of claim 18, further comprising: attaching a cap to the top side of the substrate, the cap defining a cavity above the top side of the diaphragm.

* * * * *